United States Patent [19]

Takahashi

[11] Patent Number: 4,470,037

[45] Date of Patent: Sep. 4, 1984

[54] INPUT DEVICE FOR ELECTRONIC APPARATUS

[75] Inventor: Hiroshi Takahashi, Yokohama, Japan

[73] Assignee: Canon Kabushiki Kaisha, Tokyo, Japan

[21] Appl. No.: 304,501

[22] Filed: Sep. 22, 1981

Related U.S. Application Data

[63] Continuation of Ser. No. 82,535, Oct. 9, 1979, abandoned.

[30] Foreign Application Priority Data

Jan. 17, 1979 [JP] Japan ................................. 54-4353

[51] Int. Cl.³ ............................. G08C 9/00; G06F 1/00
[52] U.S. Cl. ............................. 340/365 R; 340/365 S; 364/709
[58] Field of Search ................... 340/365 R, 365 S; 364/709, 710, 707, 705; 179/90 K; 178/17 C; 400/479, 479.1

[56] References Cited

U.S. PATENT DOCUMENTS

| | | | |
|---|---|---|---|
| 3,195,124 | 7/1965 | Gebhardt | 340/365 S |
| 3,623,588 | 11/1971 | Prodan | 340/365 S |
| 3,863,060 | 1/1975 | Rode et al. | 364/709 |
| 3,976,840 | 8/1976 | Cleveland et al. | 340/365 R |
| 4,042,439 | 8/1977 | Pounds | 340/365 R |
| 4,117,542 | 9/1978 | Klausner et al. | 364/709 |
| 4,120,036 | 10/1978 | Maeda et al. | 364/705 |
| 4,122,526 | 10/1978 | Dlugos et al. | 364/705 |

*Primary Examiner*—Donnie L. Crosland
*Attorney, Agent, or Firm*—Fitzpatrick, Cella, Harper & Scinto

[57] ABSTRACT

An input device for electronic apparatus includes key signal output lines each having plural key switches connected thereto and circuitry for identifying the same key signal under the control of plural keys.

3 Claims, 4 Drawing Figures

INPUT DEVICE FOR ELECTRONIC APPARATUS

This is a continuation of application Ser. No. 082,535, filed Oct. 9, 1979, now abandoned.

BACKGROUND OF THE INVENTION

1. Field of the Invention

This invention relates to an input device for electronic apparatus.

2. Description of the Prior Art

The recent advancement in the performance of electronic apparatus such as electronic calculators brought about by the progress of the large-scale integrated circuits is resulting in the increase in number of the key switches constituting a part of the input device. Therefore, for example in calculators capable of functional calculations, a compact structure is generally achieved by the use of double- or triple-function keys wherein each key performs plural functions by combinations with other keys.

Also the increase in number of keys leads to the increase in number of input/output ports of the large-scale integrated circuit, and the use of the above-mentioned double- or triple-function keys has been an effective measure for preventing such increase. However multiple functions represented by a single key are difficult to learn for the users and inevitably lead to complicated and easily mistakable operations.

SUMMARY OF THE INVENTION

An object of the present invention is to provide electronic apparatus provided with a key input device wherein each key represents a single function without increasing the number of input/output ports of the large-scale integrated circuit.

The present invention will be better understood in view of the following description of an embodiment thereof represented in the accompanying drawings.

DESCRIPTION OF THE PREFERRED EMBODIMENTS

Figure 1:
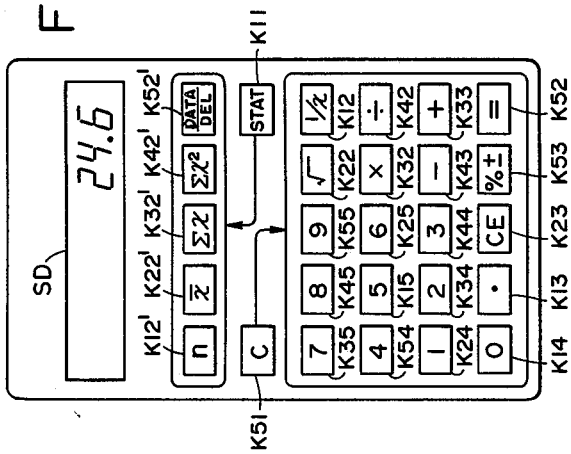
FIG. 1 is a plan view showing the key arrangement in an embodiment of the present invention.

FIG. 1 shows a front view of an electronic calculator embodying the present invention. At use, after a power switch (not shown) is turned on, a clear key K51 is actuated for "all clear", whereby the calculator is placed in the ordinary arithmetic calculation mode in which the keys K12 (1/x), K22 ($\sqrt{\ }$), K32 (x), K42 (+) and K52 (=) can be used. In this state the keys K12' (n), K22' ($\bar{x}$), K32' ($\rho x$), K42' ($\Sigma x^2$) and K52' (DATA/DEL), which are not used in this mode, are designed to perform, if they are actuated, the respectively same functions as those of the above-mentioned keys K12, K22, K32, K42 and K52. Upon actuation of a key K11 (STAT) for shifting the calculator to the statistical calculation mode, keys K12', K22', K32', K42' and K52' respectively perform the functions of entering instructions for calculation of data number, calculation standard deviation, calculation of total summation, calculation of total square summation and data input or correction in the statistical calculations. Similarly in this state the above-mentioned keys K12, K22, K32, K42 and K52 for arithmetic calculation, which are not used in this mode, are designed to perform, if they are actuated, the same functions as those of keys K12', K22', K32', K42' and K52'.

In this manner each key represents a single function so that the input device is easy to learn and unmistakable, and still it is not necessary to increase the number of input/output ports of the large-scale integrated circuit. The above-explained arrangement will be further explained in connection with FIGS. 2 and 3.

Figure 4:
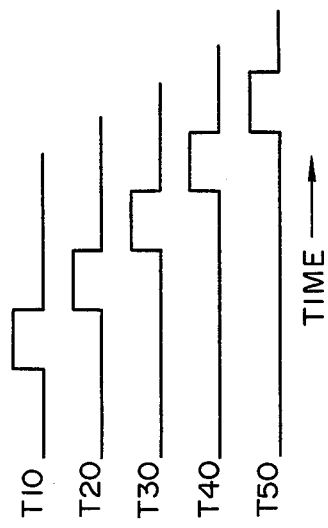
FIG. 4 is a chart showing the timing pulses for scanning the key matrix.
Figure 3:
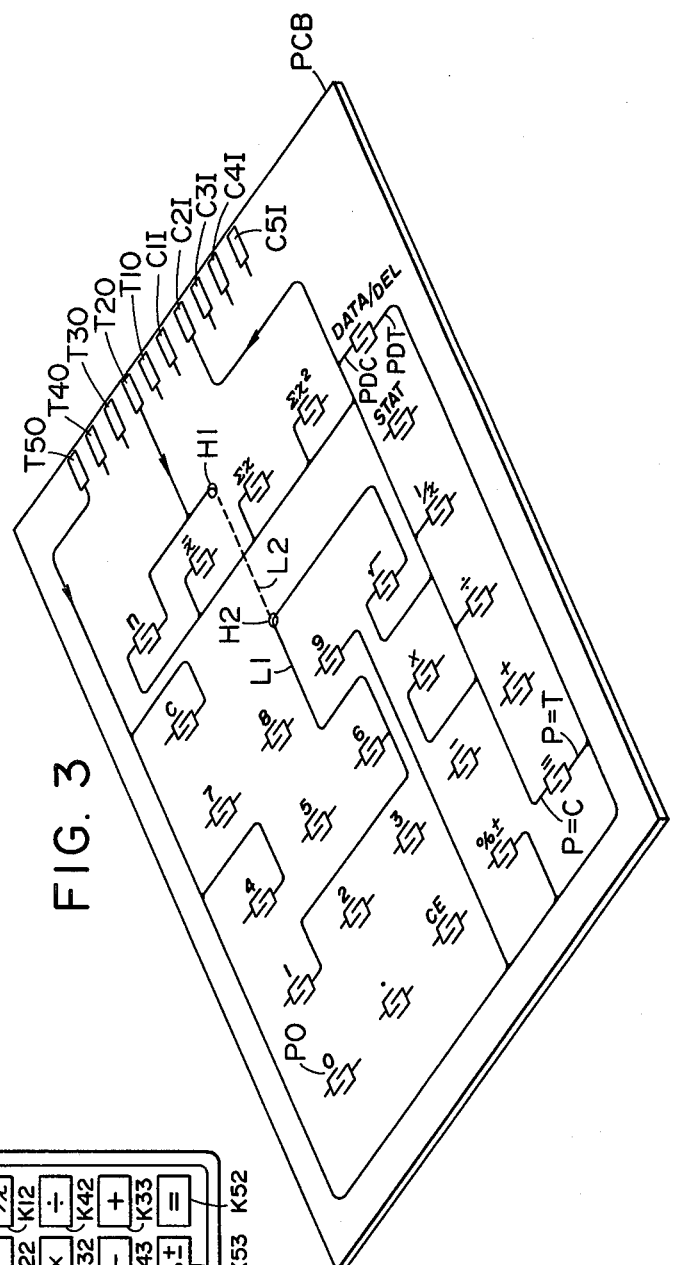
FIG. 3 is a perspective view of the printed circuit board to be employed in the keyboard unit thereof.
Figure 2:
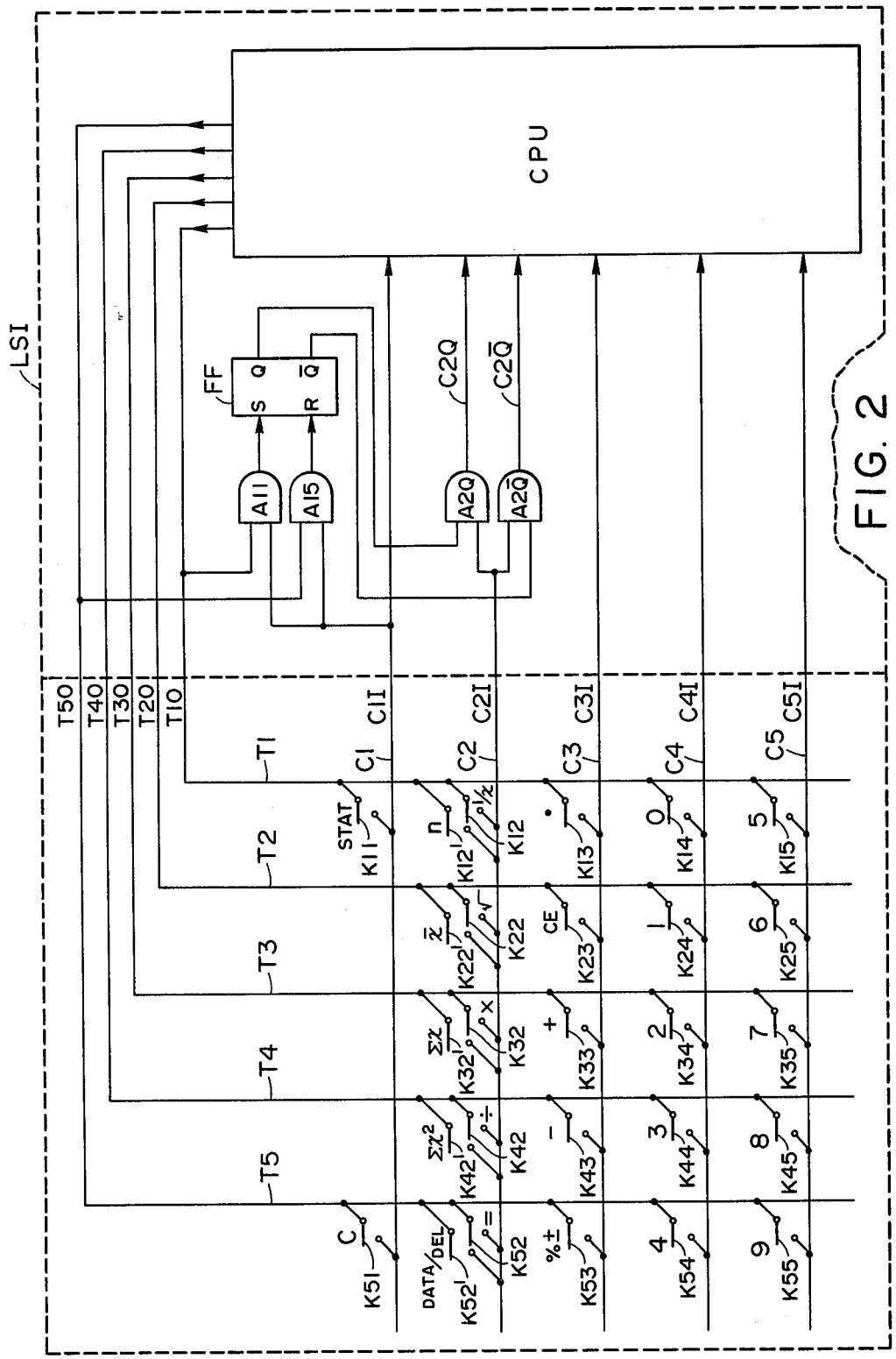
FIG. 2 is a schematic block diagram of an embodiment of the present invention.

FIG. 2 shows a schematic circuit diagram of the key arrangement for obtaining the above-explained easily usable key input device while FIG. 3 shows a printed circuit board therefor, wherein T1 to T5 designate circuits for timing signals, which are shown in FIG. 4, for key matrix scanning to be released from a central processing unit CPU, and C1 to C5 denote key signal output lines constituting the rows of the key matrix and functioning as key signal input ports for processing unit CPU. As shown in FIG. 2, the keys K12 (1/x) and K12' (n), for example, are connected in parallel.

Referring to FIG. 3, a printed circuit board PCB of the keyboard unit is provided with printed circuits on both faces thereof, wherein a solid line L1 indicates a printed pattern on the top face while a broken line L2 is a printed pattern on the bottom face, which patterns are mutually connected by means of through-holes H1, H2. On the upper end of the printed circuit board there are shown input and output terminals C1I–C5I and T10–T50 for the keys. The combined fork-shaped patterns connected to the terminals constitute the key contacts, on which there will be provided an electroconductive rubber sheet. Upon pressing for example a key K14 (0), the electroconductive rubber comes into contact with the pattern P0 to connect electrically the corresponding fork-shaped patterns thereby generating a key signal T1×C4. In a similar manner 25 different key signals can be introduced into the processing unit CPU by the combination of 5 different timings T10–T50 and 5 different positions C1I–C5I. The arrangement of these contact patterns P corresponds to the key arrangement shown in FIG. 1.

As shown in FIG. 2, the keys K52 (=) and K52' (DATA/DEL) for example are both connected to the same signal lines T5 and C2. This is realized on the printed circuit board shown in FIG. 3 by connecting the terminal C21 to a contact pattern P=C for the key K52 (=) and also to a contact pattern PDC for the key K52' (DATA/DEL) and the terminal T50 to another contact pattern P=T of key K52 and also to another contact pattern PDT of key K52', thus achieving the parallel connection of keys K52 and K52'.

Similarly the keys K12 (1/x) and K12' (n) are connected in common to the terminals T20 and C2I, and other keys are also connected in pairs of K22-K22', K32-K32' and K42-K42'. The printed patterns from the contacts of these keys to respective terminals are omitted from the drawing for the purpose of clarity.

In FIG. 2 there is provided a flip-flop FF for storing a signal representative of the calculating mode which is set, upon actuation of a key STAT for selecting the statistical calculation mode, in response to the opening of an AND gate A11 at a time T10 shown in FIG. 4, and is reset, upon actuation of a clear key C in response to the opening of an AND gate A15 at the time T50 shown in FIG. 4. The processing unit CPU performs the statistical calculations upon receipt of a level "1" signal from the port Q of flip-flop FF.

Set signal Q, a high level enables an AND gate A2Q, and complement signal $\overline{Q}$, a low level, disables an AND gate A2$\overline{Q}$ whereby the output signal line C2$\overline{Q}$ is placed at the level "0". Consequently the actuation of either the key K12 or K12', for example, results in an output signal T10×C2I on the output signal line C2Q. In this manner the processing unit CPU identifies the actuation of the key K12' (n) or K12 (1/x) and also identifies the statistical calculation mode from the zero output signal on the signal line C2$\overline{Q}$, thus performing the calculation of data number in the statistical calculation mode. In a similar manner the processing unit CPU identifies four other instructions for $\bar{x}$, $\Sigma x$, $\Sigma x^2$ and DATA/DEL by receiving the zero signal from the line C2$\overline{Q}$ and also receiving the output signal from the line C2Q respectively at the timing T20, T30, T40 or T50. As already explained in the foregoing, such an instruction signal can be supplied from either of paired keys K22'-K22, K32'-K32, K42'-K42 or K52'-K52.

Upon actuation of the key K51 (C) for shifting the calculator to the arithmetic calculation mode, the flip-flop FF is reset to disable the AND gate A2Q and to enable the AND gate A2$\overline{Q}$, whereby the processing unit CPU identifies the arithmetic calculation mode from the zero signal level on the signal line C2Q. Also in this state, as explained in the foregoing, the processing unit CPU is capable of identifying five different key signals from the arithmetic instruction keys K12, K22, K32, K42 and K52 to be supplied on the line C2$\overline{Q}$ respective at the time T10, T20, T30, T40 and T50. In this state, as aforementioned, the signals generated by the actuation of the keys K12', K22', K32', K42' and K52' are supplied to the processing unit CPU as the instructions for arithmetic calculations 1/x, $\sqrt{\phantom{x}}$, x, + and =.

As discussed in the foregoing, the present invention overcomes the difficulty in learning and in use of conventional double- or triple-function keys each representing multiple functions without increasing the number of input/output ports of the central processing unit, thereby providing electronic apparatus equipped with an easily usable key input device.

What I claim is:

1. An input device for an electronic apparatus, comprising:
    a plurality of input keys;
    a first key signal line to which said input keys are connected;
    a plurality of first AND gate means each having at least two inputs, one said input being connected to said first key signal line, each of said first AND gates also having an output for providing an instruction signal; and
    setting means for selecting one of said first AND gate means, said setting means including memory means, connected to another input of each of said first AND gate means for producing output signals for selectively enabling any of said first AND gate means, said setting means further including a plurality of switches connected to said memory means for selecting the output signals to be produced by said memory means.

2. An input device for an electronic apparatus according to claim 1, wherein said memory means has input means and wherein said setting means further includes a plurality of second AND gate means for changing the output signals produced by said memory means, each of said second AND gate means having at least one input and an output connected to said input means of said memory means, and wherein said setting means also includes a second key signal line connected between each of said switches and an input of each of said second AND gate means.

3. An input device for electronic apparatus according to claim 1, wherein one of said switches includes a clear key.

* * * * *